(12) United States Patent
Iijima et al.

(10) Patent No.: US 9,240,438 B2
(45) Date of Patent: Jan. 19, 2016

(54) PASSIVE-MATRIX DISPLAY AND TILING DISPLAY

(71) Applicant: PANASONIC CORPORATION, Osaka (JP)

(72) Inventors: Hiroaki Iijima, Osaka (JP); Yasuhiro Arai, Shiga (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/410,801

(22) PCT Filed: Apr. 3, 2014

(86) PCT No.: PCT/JP2014/001930
§ 371 (c)(1),
(2) Date: Dec. 23, 2014

(87) PCT Pub. No.: WO2014/174773
PCT Pub. Date: Oct. 30, 2014

(65) Prior Publication Data
US 2015/0123097 A1 May 7, 2015

(30) Foreign Application Priority Data

Apr. 25, 2013 (JP) .................... 2013-092741

(51) Int. Cl.
*H01L 29/18* (2006.01)
*H01L 27/32* (2006.01)
(Continued)

(52) U.S. Cl.
CPC .............. *H01L 27/3288* (2013.01); *G09F 9/30* (2013.01); *G09F 9/40* (2013.01); *H01L 27/329* (2013.01);
(Continued)

(58) Field of Classification Search
CPC ............ H01L 27/3281; H01L 27/3283; H01L 27/3288; H01L 27/3293; H01L 51/5212; H01L 51/5215
USPC ........................................................... 257/88
See application file for complete search history.

(56) References Cited

U.S. PATENT DOCUMENTS 6,140,765 A * 10/2000 Kim ..................... H01L 27/3281
313/498
2001/0048275 A1* 12/2001 Nakada .................. H01J 11/12
315/160
(Continued)

FOREIGN PATENT DOCUMENTS

JP          63-83798 U       6/1988
JP          2006-190630      7/2006
(Continued)

OTHER PUBLICATIONS
International Search Report (ISR) of International Patent Application No. PCT/JP2014/001930, dated Jul. 1, 2014.

*Primary Examiner* — Nicholas Tobergte
(74) *Attorney, Agent, or Firm* — Greenblum & Bernstein, P.L.C.

(57) ABSTRACT

A passive-matrix display of the disclosure includes a first electrode disposed over a substrate, a second electrode disposed over the first electrode and three-dimensionally intersecting the first electrode, a first auxiliary electrode disposed between the substrate and the first electrode, three-dimensionally intersecting the first electrode and being parallel to the second electrode, and a second auxiliary electrode parallel to the first auxiliary electrode and to the second electrode, the first electrode and the first auxiliary electrode being electrically connected by a first connection portion, and the second electrode and the second auxiliary electrode being connected by a plurality of second connection portions each disposed with at least one of the first electrodes therebetween. The passive-matrix display enables voltage drop and variation in brightness to be reduced by lowering the wiring resistance of the second electrode.

10 Claims, 10 Drawing Sheets

(51) Int. Cl.
    *G09F 9/30* (2006.01)
    *G09F 9/40* (2006.01)
    *H01L 51/52* (2006.01)

(52) U.S. Cl.
    CPC ......... *H01L 27/3281* (2013.01); *H01L 27/3283* (2013.01); *H01L 27/3293* (2013.01); *H01L 51/5212* (2013.01); *H01L 51/5215* (2013.01)

(56) References Cited

U.S. PATENT DOCUMENTS

| | | | | |
|---|---|---|---|---|
| 2002/0014834 A1* | 2/2002 | Uchida | ............... | H01L 27/3237 313/504 |
| 2002/0033920 A1* | 3/2002 | Sun | .................. | G06F 3/044 349/139 |
| 2005/0022740 A1* | 2/2005 | Hatano | ............... | C23C 16/4405 118/723 E |
| 2006/0138943 A1 | 6/2006 | Kim | | |
| 2009/0001868 A1* | 1/2009 | Nakamura | ................ | H01J 9/32 313/496 |
| 2010/0283066 A1* | 11/2010 | Ono | ....................... | H05B 33/20 257/88 |

FOREIGN PATENT DOCUMENTS

| | | |
|---|---|---|
| JP | 2008-300332 | 12/2008 |
| JP | 2012-032471 | 2/2012 |

\* cited by examiner

PASSIVE-MATRIX DISPLAY AND TILING DISPLAY

TECHNICAL FIELD

The present disclosure pertains to a passive-matrix display and to a tiling display making use thereof.

BACKGROUND ART

In recent years, tiling displays have been developed in which a plurality of passive-matrix displays are combined for use in large-scale digital signage, and such displays are spreading.

Organic electroluminescence display 800 is an example of a conventional passive-matrix display for use in a tiling display. FIG. 9A shows a plan view and FIG. 9B shows a cross-sectional view taken along line A-A. The conventional organic electroluminescence display 800 includes a plurality of first electrodes 802 disposed as stripes over the first substrate 801 and a plurality of second electrodes 804 disposed as stripes that three-dimensionally intersect the first electrodes 802. An organic electroluminescence layer 806 is provided at each intersection between the first electrodes 802 and the second electrodes 804, and an insulating layer 803 is provided in remaining areas. A protective layer 805 is also provided over the second electrode 804. A signal retrieval unit that includes a mounting area for a signal input driver is provided at the ends 802a of the first electrodes 802 in the X-direction, and at the ends 804a of the second electrodes 804 in the Y-direction.

This configuration for the tiling display using the organic electroluminescence display 800 shown in FIGS. 9A and 9B has the signal retrieval unit on two sides. The areas where the signal retrieval units are located is a non-display region. Thus, the surface area of the contour is increased, which poses a problem in that the whole is not perceived as a single display.

The organic electroluminescence display 900 of Patent Literature 1 uses a unidirectional wiring method to reduce the surface area of the contour.

Specifically, as shown in FIG. 10, the display includes a plurality of first electrodes 902 disposed as stripes over a first substrate 901 and a plurality of second electrodes 904 disposed as stripes that three-dimensionally intersect the first electrodes 902. An organic electroluminescence layer 905 is provided at each intersection between the first electrodes 902 and the second electrodes 904. Below the second electrodes 904, a plurality of second auxiliary electrodes 903 are disposed in portions where the organic electroluminescence layer 905 is not located. The second auxiliary electrodes 903 three-dimensionally intersect the second electrodes 904 and are parallel to the first electrodes 902. Also, contact holes 906 acting as connection portions for electrical connection are provided at each position where the second electrodes 904 and the second auxiliary electrodes 903 three-dimensionally intersect. Accordingly, the passive-matrix organic electroluminescence display 900 of Patent Literature 1 realizes the unidirectional wiring to have the signal retrieval unit on only one side in the X-direction.

CITATION LIST

Patent Literature

[Patent Literature 1]
Japanese Unexamined Patent Publication No. 2012-32471

SUMMARY OF INVENTION

Technical Problem

However, the configuration of Patent Literature 1 provides electrical connection between each of the second electrodes 904 and each of the second auxiliary electrodes 903 only at a single three-dimensional intersection. Thus, the wiring resistance for each second electrode 904 increases with distance from the connection portion 906 to one of the second auxiliary electrodes 903. As a result, variation in brightness occurs due to a drop in voltage.

The present disclosure provides a passive-matrix display and a tiling display enabling the drop in voltage caused by wiring resistance to be constrained, which produces an averaging of the variation in brightness.

Solution to Problem

In order to achieve the above-stated aim, the present disclosure provides a passive-matrix display, including: a substrate; a plurality of first electrodes provided as stripes above the substrate; a plurality of second electrodes provided as stripes above the first electrodes and three-dimensionally intersecting the first electrodes; a light-emitting layer provided between each of the first electrodes and each of the second electrodes at three-dimensional intersections between the first electrodes and the second electrodes; a plurality of first auxiliary electrodes provided between the substrate and the first electrodes, three-dimensionally intersecting the first electrodes and being parallel to the second electrodes; and a plurality of second auxiliary electrodes provided between the substrate and the first electrodes, being parallel to the first auxiliary electrodes and to the second electrodes, wherein each of the first electrodes and each of the first auxiliary electrodes are electrically connected via a first connection portion, and each of the second electrodes and each of the second auxiliary electrodes are electrically connected via a second connection portion disposed in plurality, the plurality of second connection portions having at least one of the first electrodes therebetween.

Advantageous Effects of Invention

A passive-matrix display pertaining to an aspect of the disclosure has a plurality of second electrodes and a plurality of second auxiliary electrodes arranged in parallel thereto. Accordingly, a configuration is realized in which the second electrodes and the second auxiliary electrodes are electrically connected via second connection portions each disposed with at least one of the first electrodes therebetween.

According to this configuration, increasing the quantity of connection locations in comparison to Patent Literature 1, in which there is only one connection location, enables the distance from the connection portion on each second electrode to the farthest point to be reduced. Thus, the wiring resistance is reduced in each of the second electrodes, which enables the drop in voltage and the variation in brightness to be reduced.

As such, according to the passive-matrix display pertaining to an aspect of the disclosure, a passive-matrix display and a tiling display are provided in which the drop in voltage caused by wiring resistance is constrained, and the variation in brightness is averaged out.

DESCRIPTION OF EMBODIMENT

<Aspects of Disclosure>

Figure 1:
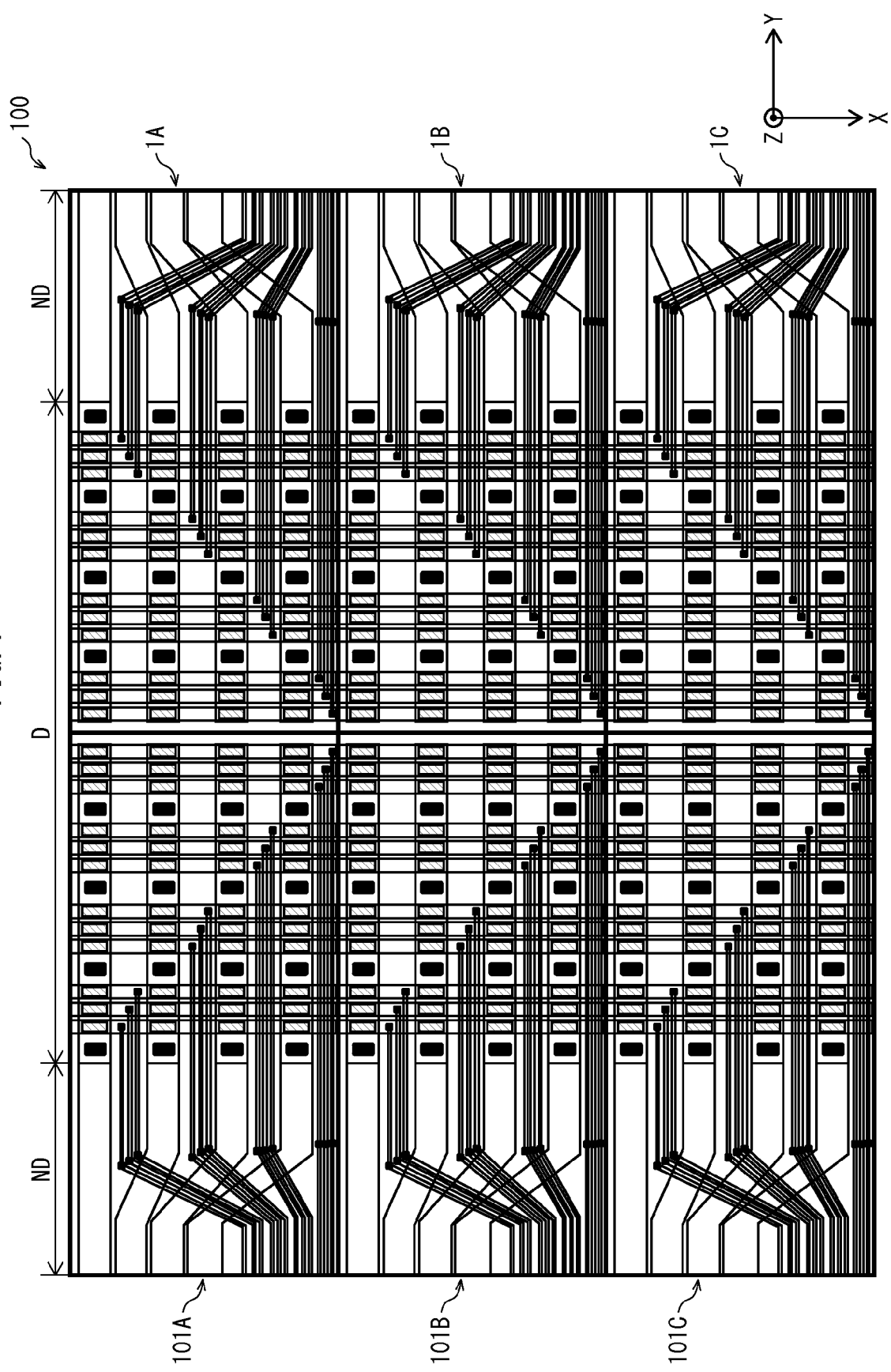
FIG. 1 is a plan view of a tiling display pertaining to the Embodiment.

In one aspect, a passive-matrix display comprises: a substrate; a plurality of first electrodes provided as stripes above the substrate; a plurality of second electrodes provided as stripes above the first electrodes and three-dimensionally intersecting the first electrodes; a light-emitting layer provided between each of the first electrodes and each of the second electrodes at three-dimensional intersections between the first electrodes and the second electrodes; a plurality of first auxiliary electrodes provided between the substrate and the first electrodes, three-dimensionally intersecting the first electrodes and being parallel to the second electrodes; and a plurality of second auxiliary electrodes provided between the substrate and the first electrodes, being parallel to the first auxiliary electrodes and to the second electrodes, wherein each of the first electrodes and each of the first auxiliary electrodes are electrically connected via a first connection portion, and each of the second electrodes and each of the second auxiliary electrodes are electrically connected via a second connection portion disposed in plurality, the plurality of second connection portions having at least one of the first electrodes therebetween.

Also, as seen in a plan view, each of the second auxiliary electrodes at least partially overlaps one of the second electrodes.

In addition, the second electrodes are optically transmissive.

Further, the substrate is flexible.

Additionally, a second substrate provided above the second electrodes.

Furthermore, the light-emitting layer is an organic electroluminescence layer.

Further still, each of the second electrodes and each of the second auxiliary electrodes are electrically connected at a respective one of the second connection portions via an electrode layer that includes material having the same composition as the first electrodes.

Yet additionally, the substrate includes a display region having a periphery at outermost edges of the light-emitting layer, and a non-display region neighboring the display region, a plurality of first external terminals that connect externally are provided above the substrate in the non-display region, each of the first auxiliary electrodes and each of the first external terminals are electrically connected, a plurality of second external terminals that connect externally are provided above the substrate in the non-display region at respective ends of the second auxiliary electrodes, a plurality of first paths are provided, each extending from the light-emitting layer along one of the first electrodes to one of the first external terminals, one of the first paths with a highest wiring resistance having resistance R1, a second path extends from the same light-emitting layer as the one of the first paths with the highest wiring resistance along one of the second electrodes to one of the second external terminals, the second path having resistance R2, and R2<R1.

Additionally still, the substrate includes a display region having a periphery at outermost edges of the light-emitting layer, and a non-display region neighboring the display region, a plurality of linear third auxiliary electrodes is provided above the substrate in the non-display region, in the same layer as the first electrodes, each of the first auxiliary electrodes and each of the linear third auxiliary electrodes are electrically connected via a third connection portion, the linear third auxiliary electrodes each start at a respective one of the third connection portions and extend away from the display region, at least a portion of the linear third auxiliary electrodes three-dimensionally intersects at least a portion of the second auxiliary electrodes, a first mounting region being arranged at extremities of a neighboring pair of the linear third auxiliary electrodes, and the second auxiliary electrodes extend above the substrate from the display region to the non-display region, a second mounting region being arranged at extremities of a neighboring pair of the second auxiliary electrodes.

Yet further, the passive-matrix display is provided in plurality and combined into a single display.

Embodiment of the present disclosure are described in detail below, with reference to the drawings.

Embodiment

Overall Configuration

Tiling Display

First, a tiling display 100 pertaining to the Embodiment is described with reference to FIG. 1. The tiling display 100 is shown as a total of six aligned displays, including passive-matrix displays 1A, 1B, and 1C and passive-matrix displays 101A, 101B, and 101C manufactured with line symmetry with respect to the X-axis of the other displays.

Region D of FIG. 1 indicates a display region having a periphery at an outermost edge of the light-emitting layer, and regions ND indicate non-display regions, each made up of a signal retrieval unit, neighbouring the display region. The signal retrieval units are thus disposed at one end along the Y-axis, in a unidirectional wiring configuration that enables the non-display region ND to be arranged at the ends of the display with respect to the Y-axis. As a result, the display regions D of the six displays are perceived as being one display, enabling the realization of a display for large-scale digital signage in which the individual contours are not seen.

(Overall Configuration (Individual Displays))

Figure 2:
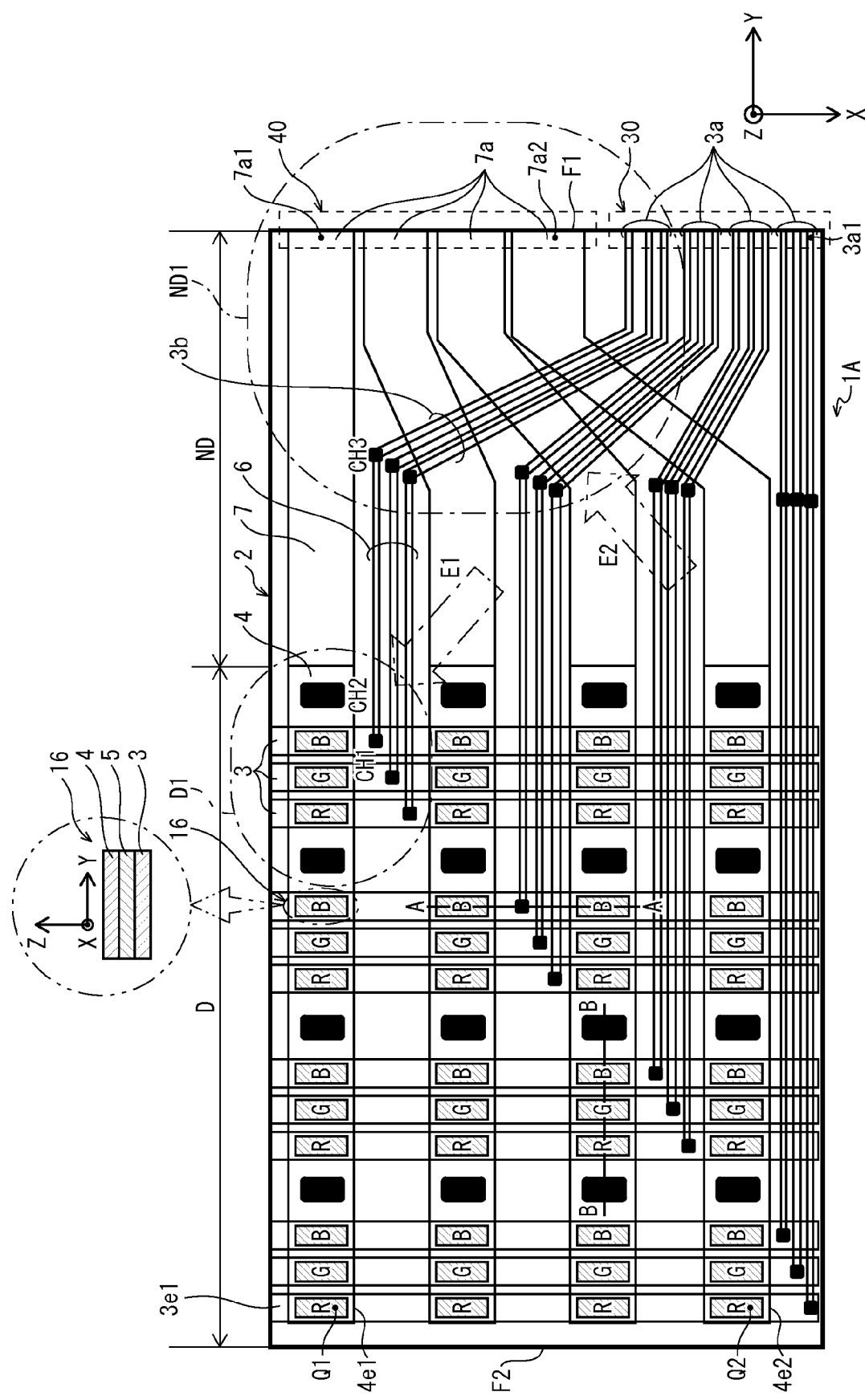
FIG. 2 is a plan view of a passive-matrix display pertaining to the Embodiment.

FIG. 2 shows passive-matrix display 1A, which is one of the displays in the tiling display 100, and is specifically a passive-matrix organic electroluminescence display. In FIG. 2, the magnified portion outlined in the double-chained line shows that an organic electroluminescence layer 5, acting as a light-emitting layer, is sandwiched between first electrodes 3 and second electrodes 4 to form light-emitting cells 16. As seen overall in a plan view, the display region D has a matrix of light-emitting cells 16 arranged thereon.

The organic electroluminescence layer 5 includes layers for emitting light in red (R), green (G), and blue (B) among the light-emitting cells, with each set of R, G, and B light-emitting cells forming one pixel.

The components represented in FIG. 1 are intended only as schematics and do not reflect any actual sizes.

(General Configuration (Display Region D))

Figure 3:
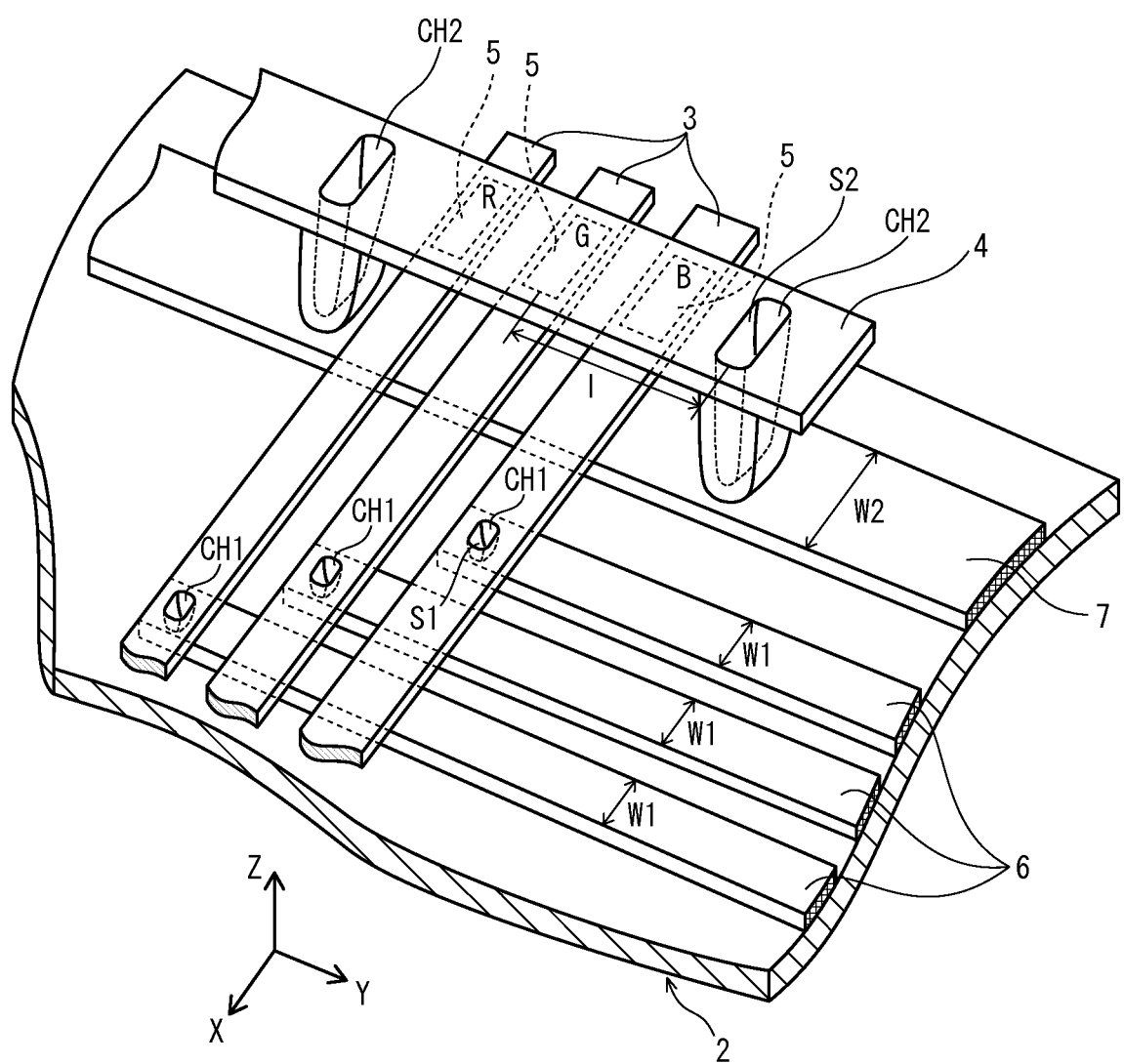
FIG. 3 is a perspective view of area D1 in the passive-matrix display pertaining to the Embodiment.

FIG. 3 shows a perspective view of region D1, encircled by a single-chained line in FIG. 2, as seen from diagonally upward in direction E1. For simplicity, only a first substrate 2 and the electrodes are shown.

A plurality of the first electrodes 3 are disposed over the first substrate 2, each being an elongated stripe extending in the X-direction. Also, a plurality of the second electrodes 4 are disposed thereover, each being an elongated stripe extending in the Y-direction (FIG. 3 shows only one, for reference. The same applies below). As described above, the organic electroluminescence layer 5 serving as the light-emitting layer is provided at every three-dimensional intersection of the electrodes. A plurality of first auxiliary electrodes 6 are provided between the first substrate 2 and the first electrodes 3, each being an elongated stripe extending in the Y-direction so as to intersect the first electrodes 3 three-dimensionally. Also, a plurality of second auxiliary electrodes 7 are provided in parallel with the first auxiliary electrodes 6 and the second electrodes 4 (FIG. 3 shows only one, for reference. The same applies below). The electrodes are described at being parallel, though no limitation is intended to an angle of 0° between the extending electrodes. An angle of ±30° relative to the center angle of 0° may also apply. In the present Embodiment, the second auxiliary electrodes 7 extend in the Y-direction.

Accordingly, this enables the first auxiliary electrodes 6 and the second auxiliary electrodes 7 to be arranged similarly extending in the Y-direction. Thus, unidirectional wiring for disposing an external terminal is realized in one end of one side of the non-display region ND of the display.

In the present Embodiment, a contact hole CH1 is formed at each intersection of one of the first electrodes 3 and one of the first auxiliary electrodes 6, electrically connecting the electrodes. However, this is not intended as a limitation. A plurality of contact holes may be used for electrical connection. The use of the term "contact hole" in the present disclosure is described in detail below.

Each of the second auxiliary electrodes 7 extends in the Y-direction and overlaps one of the second electrodes 4 as seen in a plan view. A plurality of contact holes CH2 are formed at every group of three first electrodes 3, electrically connecting the second electrodes 4 and the second auxiliary electrodes 7. Specifically, as shown in FIG. 2, one contact hole CH2 is provided in each pixel.

In the present Embodiment, the passive-matrix display 1A emits light upward (i.e., in the positive Z-direction), being a top-emission display. As such, the second electrodes 4 are optically transmissive. These optically transmissive electrodes are made of indium tin oxide (hereinafter ITO), indium zinc oxide (hereinafter IZO), or similar, which are materials with high wiring resistance. This leads to variation in brightness occurring as voltage decreases with distance from the wiring.

However, in the present Embodiment, contact holes CH2, spaced approximately every pixel, enable electrical connection between each of the second electrodes 4 and each of the second auxiliary electrodes 7. This enables the distance at which the high-resistance optically transmissive electrode is disposed to be reduced to the spacing between pixels, which has the effect of enabling a reduction in wiring resistance.

In the present Embodiment, the second auxiliary electrodes 7 are parallel to respective ones of the second electrodes 4 and also overlap the second electrodes 4 as seen in a plan view. However, the overlap need not apply in entirety. The overlap may also be partial, or the electrodes may be offset in the X-direction provided that some connectible range for the contact hole CH2 is provided.

Also, in the present Embodiment, the second electrodes 4 and the second auxiliary electrodes 7 are connected through the second connection portions (i.e., the contact holes), which are each disposed every three first electrodes (i.e., every pixel). However, no such limitation is intended. A configuration in which these second connection portions are disposed at every first electrode is also applicable. The connection portions are not limited to being contact holes. Any other configuration enabling electrical connection may be applied. For example, conductive materials or the like may be embedded in the configuration.

Examples of the electrode width, contact hole area, and other positional relationships in the present Embodiment are described below.

Each of the first auxiliary electrodes 6 has width w1, and each of the second auxiliary electrodes 7 has width w2, where w2=12.5 w1. Thus, when contact hole CH1 has surface area S1 and contact hole CH2 has surface area S2, then S2≥20 S1 is made possible.

Further, a distance 1 between the center of contact hole CH2 and the center of the organic electroluminescence layer 5 emitting green light (G) is reduced to 650 µm or less.

(General Configuration (Non-Display Region ND))

Figure 4:
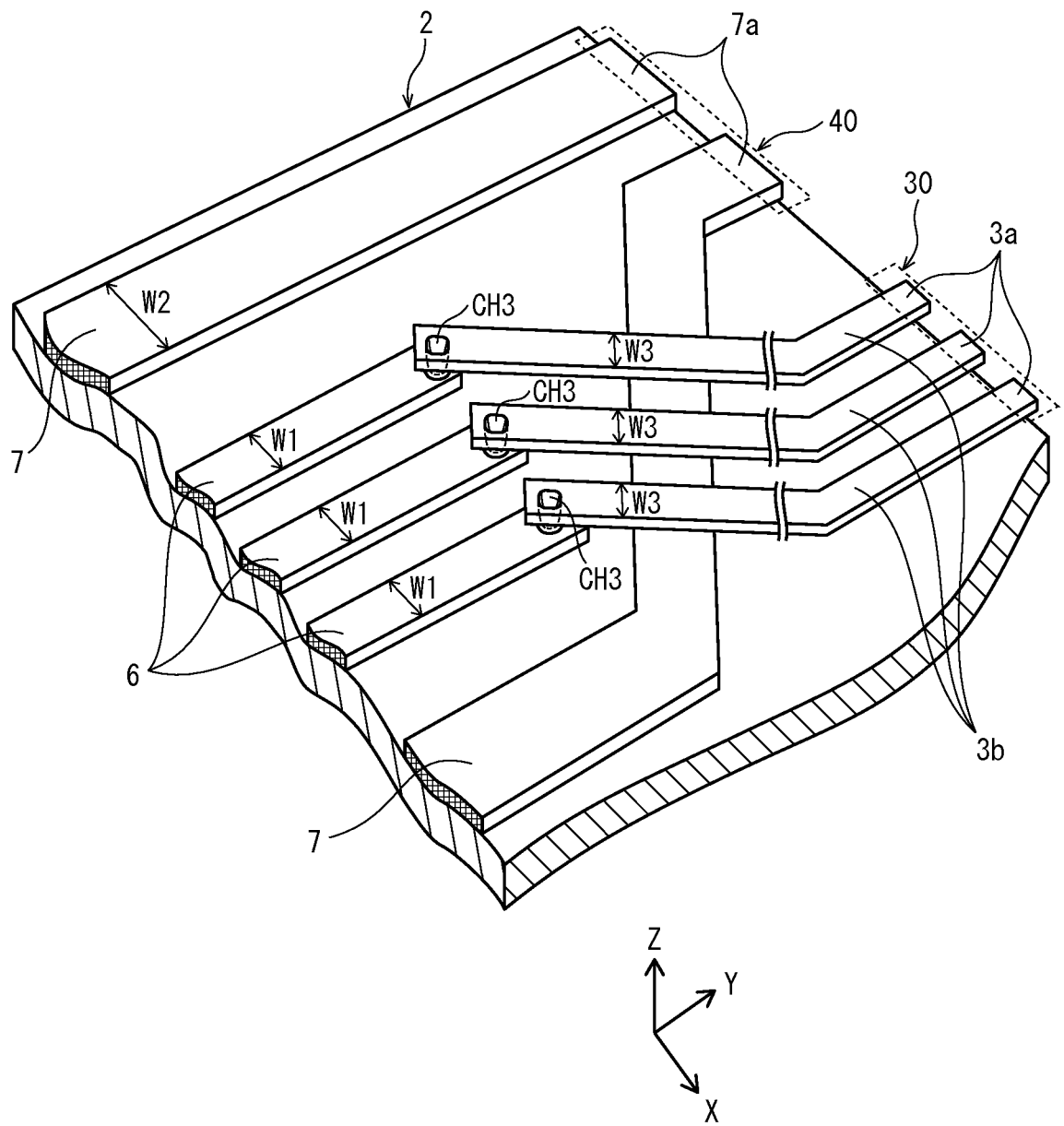
FIG. 4 is a perspective view of area ND1 in the passive-matrix display pertaining to the Embodiment.

FIG. 4 shows a perspective view of region ND1, encircled by a single-chained line in FIG. 2, as seen from diagonally upward in direction E2. For simplicity, only a first substrate 2 and the electrodes are shown. A subset of the electrodes are omitted.

A plurality of the first auxiliary electrodes 6 are provided over the first substrate 2, each being an elongated stripe extending in the Y-direction, along with a plurality of the second auxiliary electrodes 7 disposed in parallel thereto. The first auxiliary electrodes 6 are each electrically connected to a respective one of a plurality of linear third auxiliary electrodes 3b, which are in the same layer and have the same composition as the first electrode 3, via contact holes CH3 provided thereabove. Having a portion of the second auxiliary electrodes 7 and a portion of the linear third auxiliary electrode 3b intersect three-dimensionally enables these different regions to be collected. That is, at the ends of the linear third auxiliary electrode 3b, the linear third auxiliary electrodes 3b neighbor each other and at the ends of the second auxiliary electrodes 7, the second auxiliary electrodes 7 neighbor each other.

First external terminals 3a electrically connect the first electrodes 3 to the exterior, and second external terminals 7a electrically connect the second electrodes 4 to the exterior. The first external terminals 3a and the second external terminals 7a are provided at an end of one side of the display 1A within the non-display region ND. The terminals are then divided into a first mounting area 30 and a second mounting area 40 where (non-diagramed) drivers for signal input are mounted. Accordingly, the width of the space required between electrodes is reduced, which enable the surface area of the mounting areas to be constrained. Then, the two drivers for signal input (a scan line driver and a data line driver) are mountable in the respective mounting areas.

In the present Embodiment, the first auxiliary electrodes 6 are each electrically connected to one of the linear third auxiliary electrodes 3b thereabove, and three-dimensionally intersect a portion of the second auxiliary electrodes 7. However, no such limitation is intended. A portion of the second auxiliary electrodes 7 may also be intersected.

Also, in a passive-matrix display, using the first electrodes 3 for the data lines and using the second electrodes 4 for the scan lines causes the total current to flow through the organic electroluminescence layer 5, which emits light in one line for each of the second electrodes 4. As such, the current flow in the second electrodes 4 is greater in comparison to the current flow in the first electrodes 3. Thus, the electrode width w2 of the second auxiliary electrodes 7 is beneficially made greater than the electrode width w1 of the first auxiliary electrodes 6 and the electrode width w3 of the linear third auxiliary electrodes 3b. Accordingly, the wiring resistance of the second auxiliary electrodes 7 is made smaller.

(Layer Configuration (Cross-Section A-A))

Figure 5A:
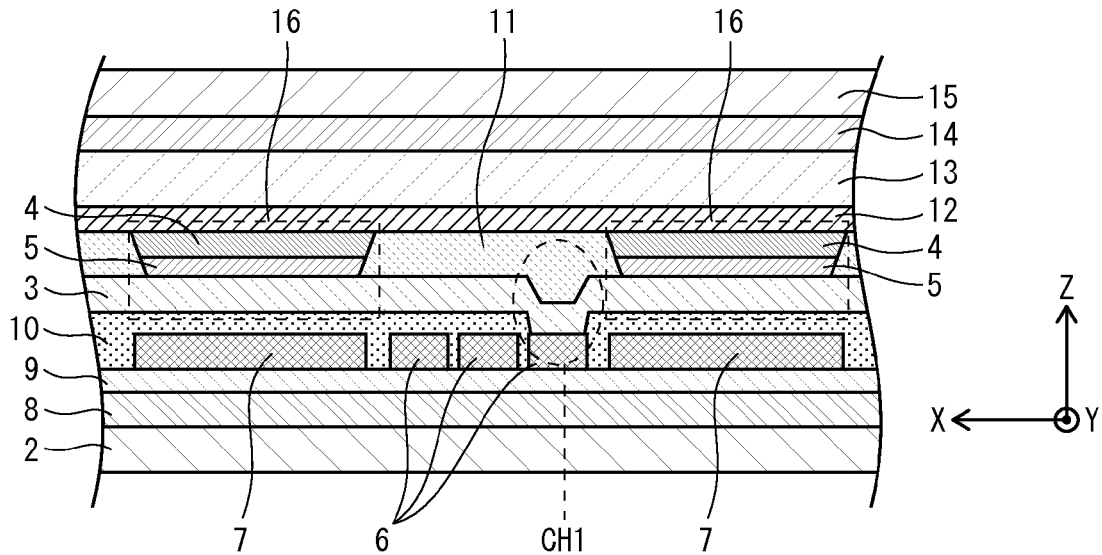
FIG. 5A is a cross-sectional view of the passive-matrix display pertaining to the Embodiment taken along line A-A (see FIG. 2)

FIG. 5A shows cross-section A-A taken from FIG. 2.

The explanations thus far have described the first substrate 2 as being a single-layer substrate in order to focus attention on the electrode configuration. However, in practice, display 1A of the Embodiment includes a pair of opposing substrates. The following describes the first substrate 2 as a bottom substrate paired with a second substrate 15 arranged as an opposing top substrate. Each of the electrodes and auxiliary electrodes is actually provided in plurality. However, the electrodes are described as singular with respect to the cross-sectional diagram discussed below.

(First Substrate 2 and Barrier Layer 8)

The first substrate 2 uses polyimide, which is a flexible material. A barrier layer 8 is provided over the first substrate 2. Water permeability is high when the first substrate 2 is made of a flexible material, which poses a problem of organic electroluminescence layer degradation. The barrier layer 8 is thus provided in order to prevent water permeability. The barrier layer 8 uses silicon nitride as a material. However, no limitation to silicon nitride is intended. Any material having low water permeability may be used, such as silicon oxynitride, silicon oxide, and so on. A metallic film or an organic material may also be used. Also, the first substrate 2 need not necessarily use a flexible material, and may also use a rigid material such as glass. When glass is used, the barrier layer need not be provided given that the water permeability of glass is low.

(Planarization Layer 9)

A planarization layer 9 is provided over the barrier layer 8. The planarization layer 9 is made of an organic acrylic material. However, this is not intended as a limitation. Any organic or inorganic material having high planarity may be used. When glass is used for the first substrate 2, the planarization layer 9 need not be provided given that glass is highly planar.

(First Auxiliary Electrode 6 and Second Auxiliary Electrode 7)

The first auxiliary electrode 6 and the second auxiliary electrode 7, which extend in the Y-direction over the planarization layer 9, are made from the same material and are disposed in the same layer. The material is a layer configuration that includes a sequence of Mo/Al/Mo. This is because the low-resistance material Al is prone to oxidation, and is thus sandwiched with Mo, which is resistant to oxidation, to provide some anti-oxidation properties. However, no limitation to this configuration is intended. The anti-oxidation layers may also be formed from some other material with similar anti-oxidation properties. Also, no limitation to Al is intended. An Al alloy, a Ag alloy, Cu, Au, or some other low-resistance material may be used. Further, a metallic material need not necessarily be used. A highly conductive material such as nanotubes or silver nanowire may also be used.

(First Insulation Layer 10)

A first insulation layer 10 is provided over the first auxiliary electrode 6 and the second auxiliary electrode 7. The first insulation layer 10 is made of an organic acrylic material. However, no such limitation is intended. An inorganic material with insulating properties, such as silicon oxide, may also be used.

(First Electrode 3)

The first electrode 3 is formed over the first insulation layer 10 and extends in the X-direction so as to three-dimensionally intersect the first auxiliary electrode 6 and the second auxiliary electrode 7. The first electrode 3 is an anode. The first electrode 3 has a layer configuration of IZO and Al alloy. The Al alloy serves as a highly-reflective electrode. Also, this configuration has the optically transmissive electrode of IZO protect the Al alloy against oxidation, such that a needle-like peak is prevented from forming at the hillock, which is a particular feature of Al. Also, the IZO being optically transmissive does not impact the high reflectivity of the Al. The organic electroluminescence layer 5 acting as the light-emitting layer emits light upward and downward. Thus, the light emitted downward (in the −Z-direction) is reflected by the Al alloy, and the light emitted upward (in the +Z-direction) exits effectively. However, no such limitation to the configuration of the first electrode 3 is intended. Any metallic material, metallic oxide material, or organic material having conductive properties may be used.

(Contact Hole CH1)

Contact hole CH1 is located at a portion of the first insulation layer 10 where a hole is provided, the hole electrically connecting the first electrode 3 to one of three first auxiliary electrodes 6. This forms a first contact hole CH1. In the present disclosure, the contact hole does not refer to a simple hole but signifies the entire contact portion providing electrical contact between the electrode of the upper layer and the electrode of the lower layer.

The previously-mentioned contact hole CH3 is provided similarly to contact hole CH1.

(Second Insulation Layer 11)

A second insulation layer 11 is provided over the first electrode 3, with an aperture therein in a portion corresponding to the light-emitting cell 16. The second insulation layer 11 is made of a material having a polyimide as a main component. However, no such limitation is intended. Another organic material or an inorganic material such as silicon oxide may also be used.

(Organic Electroluminescence Layer 5)

The organic electroluminescence layer 5 is provided in the aperture of the second insulation layer 11. The organic electroluminescence layer 5 is made of an organic material and an inorganic material, and has an internal configuration that includes a hole injection layer, a hole transport layer, the light-emitting layer, an electron transport layer, an electron injection layer, and so on, divided by function. However, no such limitation is intended. Any configuration divided by function that includes the light-emitting function may be applied.

(Second Electrode 4)

The second electrode 4 is provided over the organic electroluminescence layer 5 and extends along the Y-direction so as to three-dimensionally intersect with the first electrode 3. The second electrode 4 is an optically transmissive electrode made of, for example, a compound of Mg and Ag. The optical transmittance decreases when the second electrode 4 is made thicker. As such, a thickness of 30 nm or less is beneficial. The metal is not limited to being a compound of Mg and Ag. Either one may be used alone, or some other metal may be used. Also, no limitation to metal is intended. Provided that the optically transmissive electrode is produced, a metal oxide such as ITO, an organic material such as PEDOT, or an inorganic material such as nanotubes may also be used. The second electrode 4 is a cathode.

(Sealing Film 12)

A sealing film 12 is provided over the second electrodes 4 and the second insulation layer 11 to prevent infiltration of water and the like. The material for the sealing film 12 is, for example, silicon nitride. However, no such limitation is intended. Any material having low water permeability may be used, including a silicon resin such as silicon oxynitride, silicon oxide, and so on, or a metallic film or an organic material.

(Resin Layer 13, Barrier Layer 14, Second Substrate 15)

A resin layer 13 is provided over the sealing film 12. A barrier layer 14 and the second substrate 15 are above the resin layer 13. The resin layer 13 is made of a thermally-cured epoxy resin that serves as an adhesive between the sealing film 12 and the barrier layer 14. However, no such limitation is intended. A UV-cured epoxy resin or some other organic material may also be used. The material for the barrier layer 14 is, like the sealing film 12, silicon nitride, for example. However, no such limitation is intended. Any material having low water permeability may be used, including a silicon resin such as silicon oxynitride, silicon oxide, and so on, or a metallic film or an organic material. The material for the second substrate 15 is a polyimide. However, no such limitation is intended. PEN or PET may also be used, as well as an organic material, or even glass.

Although the above describes the barrier layer 14 as being on the side of the second substrate 15 that faces the first substrate 2, no such limitation is intended and the barrier layer 14 may also be on the opposite side as the first substrate 2. The barrier layer 14 may also have a multi-layer configuration. Also, although the above describes the first substrate 2 and the second substrate 15 as adhering via the resin layer 13, no such limitation is intended another method of adhesion may also be used.

(Layer Configuration (Cross-Section B-B))

Figure 5B:
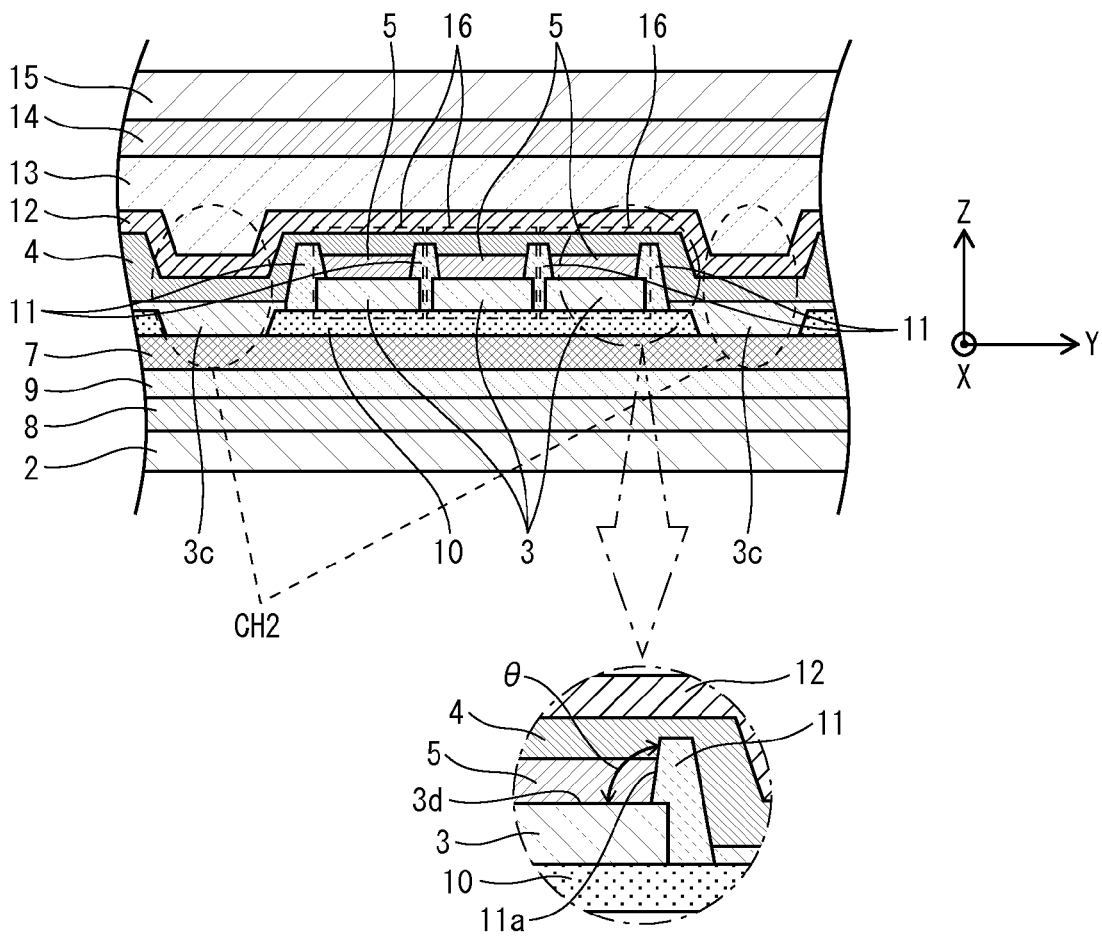
FIG. 5B is a cross-sectional view of the passive-matrix display pertaining to the Embodiment taken along line B-B (see FIG. 2).

FIG. 5B shows cross-section B-B taken from FIG. 2. The components described earlier with reference to cross-section A-A are omitted, and only the points of difference are described.

(Second Auxiliary Electrode 7)

The second auxiliary electrodes 7 are formed over the planarization layer 9 and extends in the Y-direction. The first insulation layer 10 is provided over the second auxiliary electrodes 7, with contact holes CH2 provided at corresponding portions. Then, three of the first electrodes 3 are arranged thereover with mutual separation and extending in the X-direction, and an electrode layer 3c is provided in the contact holes CH2, having the same composition as the first electrodes 3. Once the organic electroluminescence layer 5 is provided over the first electrodes 3 in the light-emitting cell 16 portions, the second electrodes 4 are then provided and extend in the Y-direction.

(Contact Holes CH2)

The second electrodes 4 enter the portions for the contact holes CH2 from above the electrode layer 3c, which is provided in the holes of the first insulation layer 10. As a result, the second electrodes 4 and the second auxiliary electrodes 7 are electrically connected. This forms the second contact hole CH2. Having the second electrodes 4 and the second auxiliary electrodes 7 be electrically connected through the electrode layer 3c in this manner enables the damage to the second auxiliary electrodes 7 caused by faulty connection to be decreased. Also, the electrode layer 3c in the contact hole 2 portion is formed during the same process as the first electrodes 3 in the light-emitting cell 16 portions, which means that there is no additional process required.

Also, the second electrodes 4 and the second auxiliary electrodes 7 may be connected through a conductive material other than the first electrode 3, but this would require an additional process. However, in such a case, a non-etchable material must be used to avoid having this conductive material be etched by the etchant used for the second electrodes 4, when etching the second electrodes 4.

(Second Insulation Layer 11)

Also, as shown in the magnified view of FIG. 5B, the end faces of the second insulation layer 11 are beneficially tapered. That is, the angle θ between end face 11a of the second insulation layer 11 and main surface 3d of the first electrodes 3 is beneficially greater than 90°. When θ is equal to or less than 90°, then when the second electrodes 4 are thin, there is a risk of breakage within the second electrodes 4 which prevents conductivity from being secured.

(Wiring Resistance Estimation Results)

The above describes a situation that enables the wiring resistance to be made lower for each of a plurality of second electrodes, because each of the second electrodes 4 is electrically connected to each of a plurality of second auxiliary electrodes 7 via a plurality of connection portions (contact holes). However, this has not yet been supported by data.

Next, the results of wiring resistance estimation for the first electrode 3 as the anode and the second electrodes 4 as the cathode are described with reference to FIG. 2.

A plurality of paths are formed from each of the locations of the light-emitting layer 5 through one of the first electrodes 3 to one of the first external terminal 3a. Among these paths, the path that has the longest wiring distance has the highest wiring resistance. The longest wiring distance occurs on the path from the light-emitting layer 5 at the top end (Q1 in terms of the light-emitting cells) through first electrode 3e1 to first external terminal 3a1, in the sequence between end F1 of the external terminal on display 1A and light-emitting layer 5 nearest an opposite end F2. This path has wiring resistance R1. Also, a path via second electrode 4e1, which is in contact with light-emitting layer 5 (Q1 in terms of the light-emitting cell), to second external terminal 7a1 has wiring resistance R2. As a result of estimation, R2 was found to be equal to or less than ¼ of R1. Also, the path from the light-emitting layer 5 at the bottom end (Q2 in terms of the light-emitting cells) through first electrode 3e1 to first external terminal 3a1, in the sequence of light-emitting layer 5 nearest an opposite end F2 has wiring resistance R3. Also, a path via second electrode 4e2, which is in contact with light-emitting layer 5 (Q2 in terms of the light-emitting cell), to second external terminal 7a2 has wiring resistance R4. As a result of estimation, R4 was found to be equal to or less than ¼ of R3. These results support the statement that the wiring resistance of the second electrode 4 acting as the cathode is lower than the wiring resistance of the second electrode of the first electrode 3 acting as the anode.

The sheet resistance for the second electrodes 4 used in the present Embodiment is on the order of 40 Ω/sq. However, although second electrodes 4 having a sheet resistance of 40 Ω/sq are used in the Embodiment, no such limitation is intended.

According to these results, the wiring resistance is lower for the second electrode and voltage drop was confirmed to be constrained.

<Variation 1>

Figure 6:
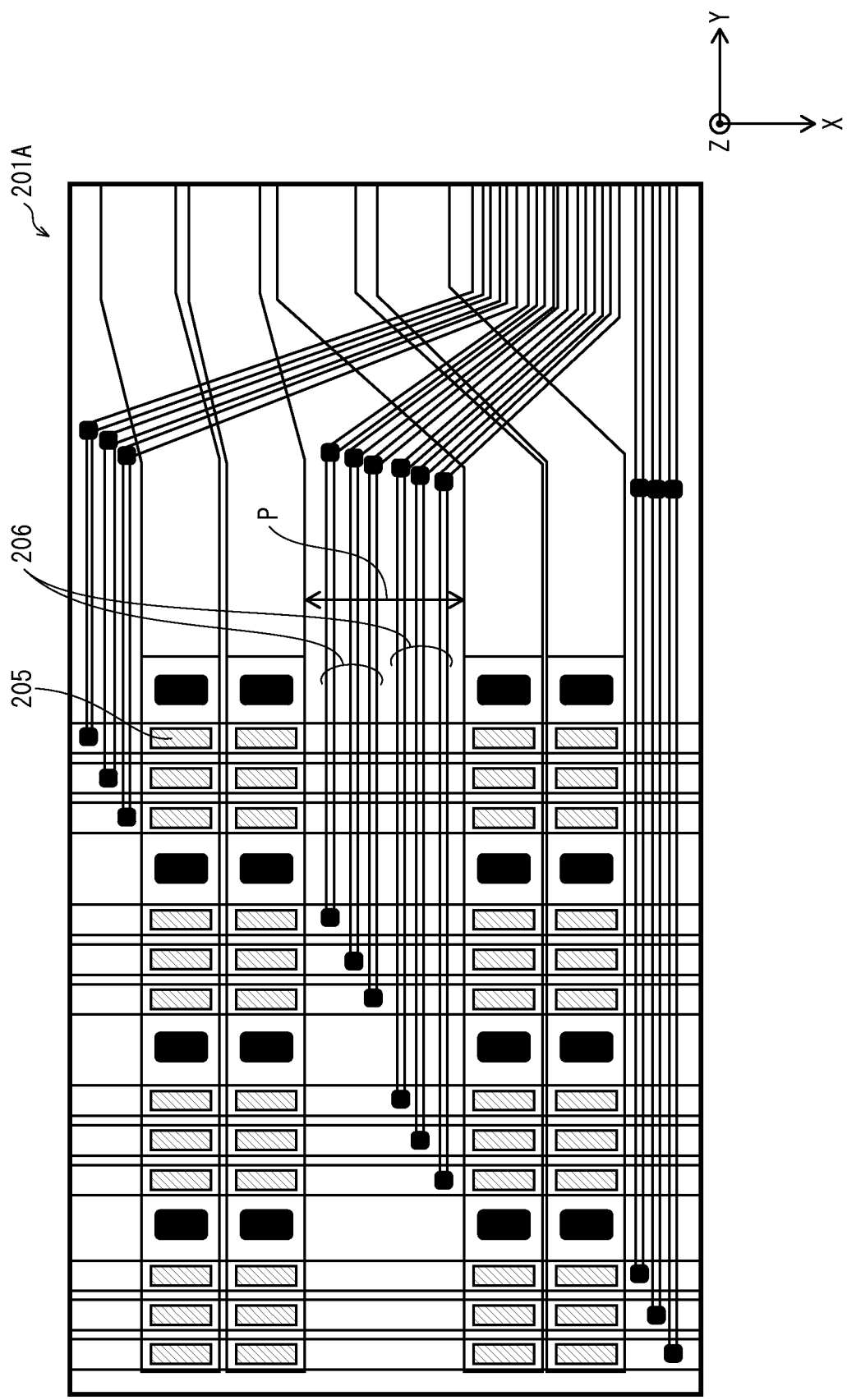
FIG. 6 is a plan view of a passive-matrix display pertaining to Variation 1.

FIG. 6 shows a passive-matrix display 201A pertaining to Variation 1. The point of difference from the passive-matrix display 1A pertaining to the Embodiment is that the first auxiliary electrodes 206 are not provided between neighboring Y-direction rows light-emitting cells 205, such that the two neighboring rows of light-emitting cells 205 are in contact. Two sets of three first auxiliary electrodes 206 are provided between a pair of light-emitting cells 205 and the next pair of light-emitting cells 205. The two pairs of the light-emitting cells 205 are separated by distance P.

Figure 7:
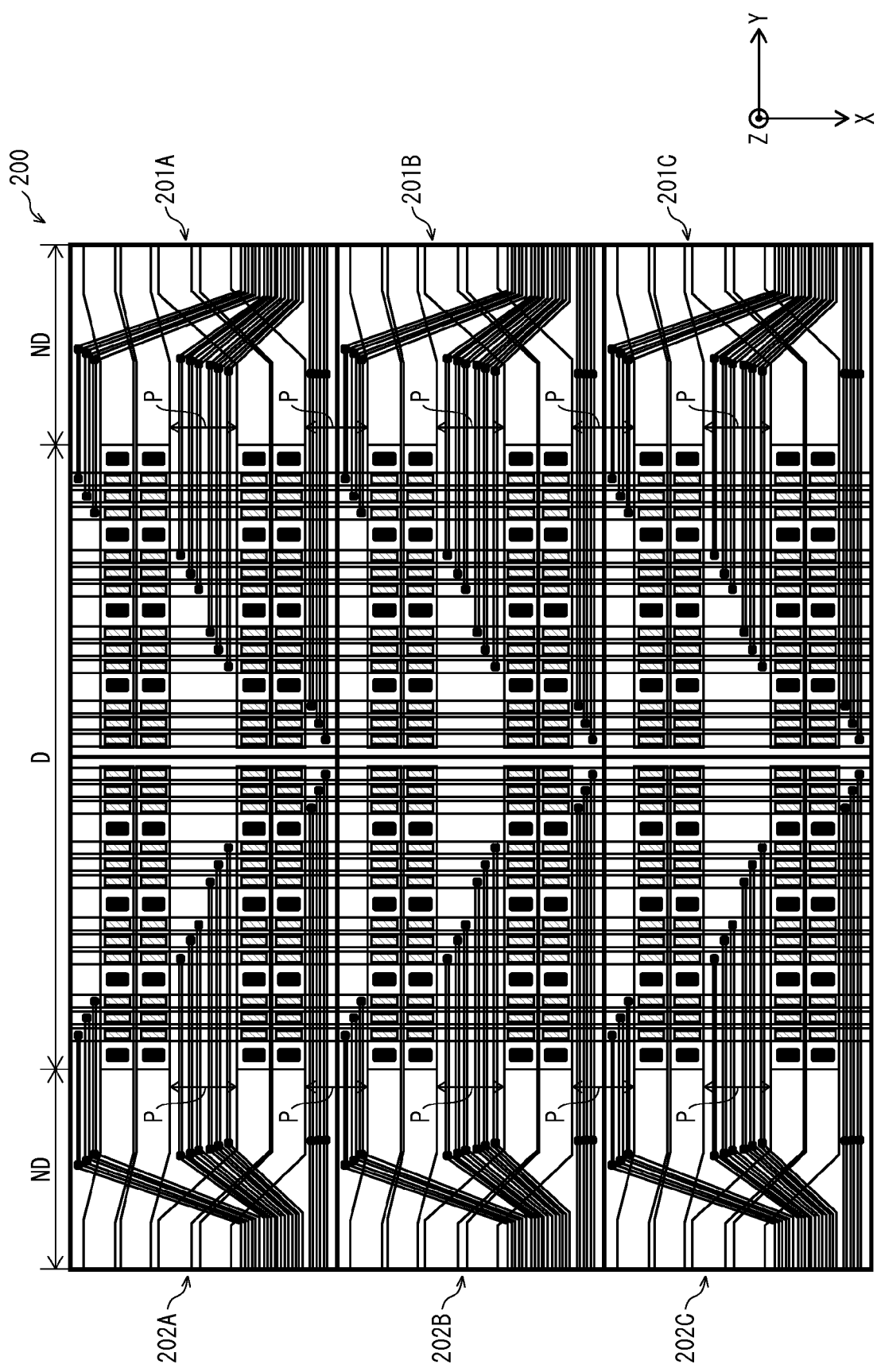
FIG. 7 is a plan view of a tiling display pertaining to Variation 1.

A tiling display 200 pertaining to Variation 1 is described next, with reference to FIG. 7. The tiling display 200 is shown as a total of six aligned displays, including passive-matrix displays 201A, 201B, and 201C and passive-matrix displays 202A, 202B, and 202C manufactured with line symmetry with respect to the X-axis of the other displays.

In Variation 1, the display regions D of six displays are, of course, perceived as being a single display. However, the distance P between a pair of light-emitting cells 205 and the next pair of light-emitting cells 205 in the Y-dimension is still P, not only within a single display 201A-201C 202A-202C but also across different displays.

Thus, in Variation 1, the six displays are perceived as smoothly combined into a single display.

<Variation 2>

Figure 8A:
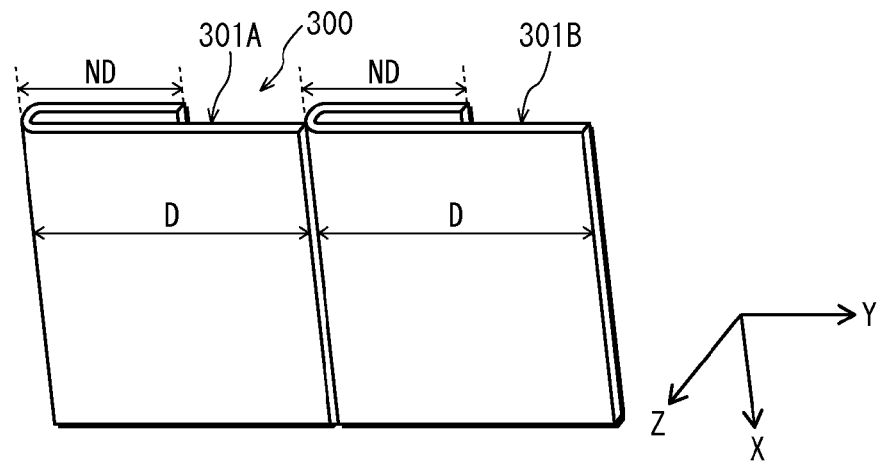
FIG. 8A is a perspective view of a tiling display pertaining to Variation 2.

FIG. 8A shows a tiling display 300 in which passive-matrix displays 301A and 301B pertaining to Variation 2 are aligned.

Here, the passive-matrix displays 301A and 301B each have a first substrate and a second substrate made of a polyimide, being flexible substrates. Thus, each display is bendable and curvable.

A tiling display 300 pertaining to Variation 2 combines the two passive-matrix displays 301A and 301B by folding the non-display regions ND away to the back. As a result, not only are the display regions D perceived as forming one display, but the non-display regions ND are also eliminated, enabling the realization of a tiling display 300 in which no borders are perceivable at all.

<Variation 3>

Figure 8B:
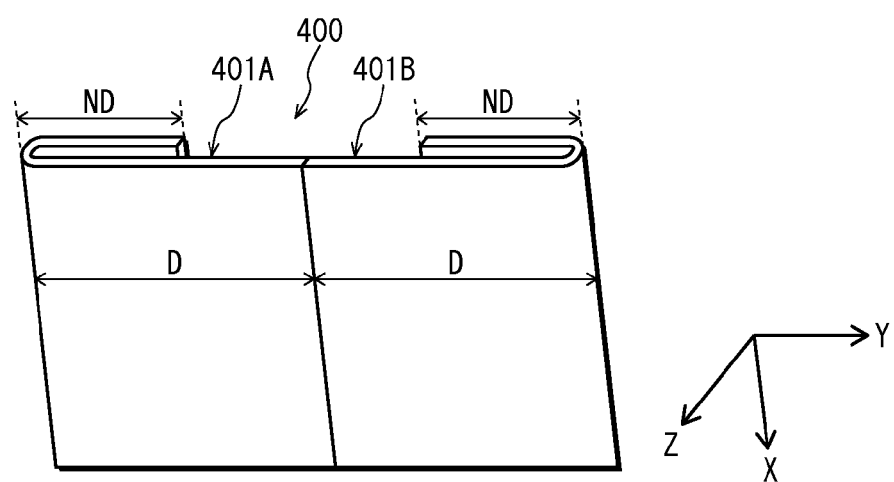
FIG. 8B is a perspective view of a tiling display pertaining to Variation 3.

Variation 3 is similar to Variation 2, differing in that the non-display region ND is folded away to the back at opposite ends, as shown in FIG. 8B. Variation 3 has the additional merit of providing space for circuit substrates and the like between non-display regions ND on the back of the tiling display 400.

<Variation 4>

Figure 8C:
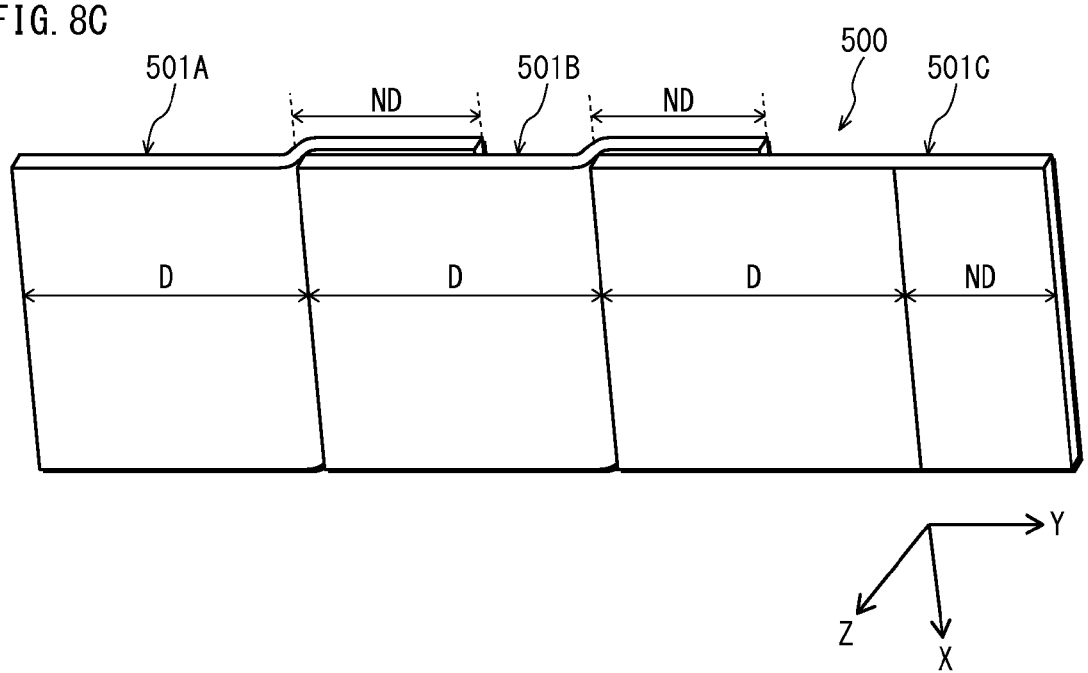
FIG. 8C is a perspective view of a tiling display pertaining to Variation 4.
Figure 9A:
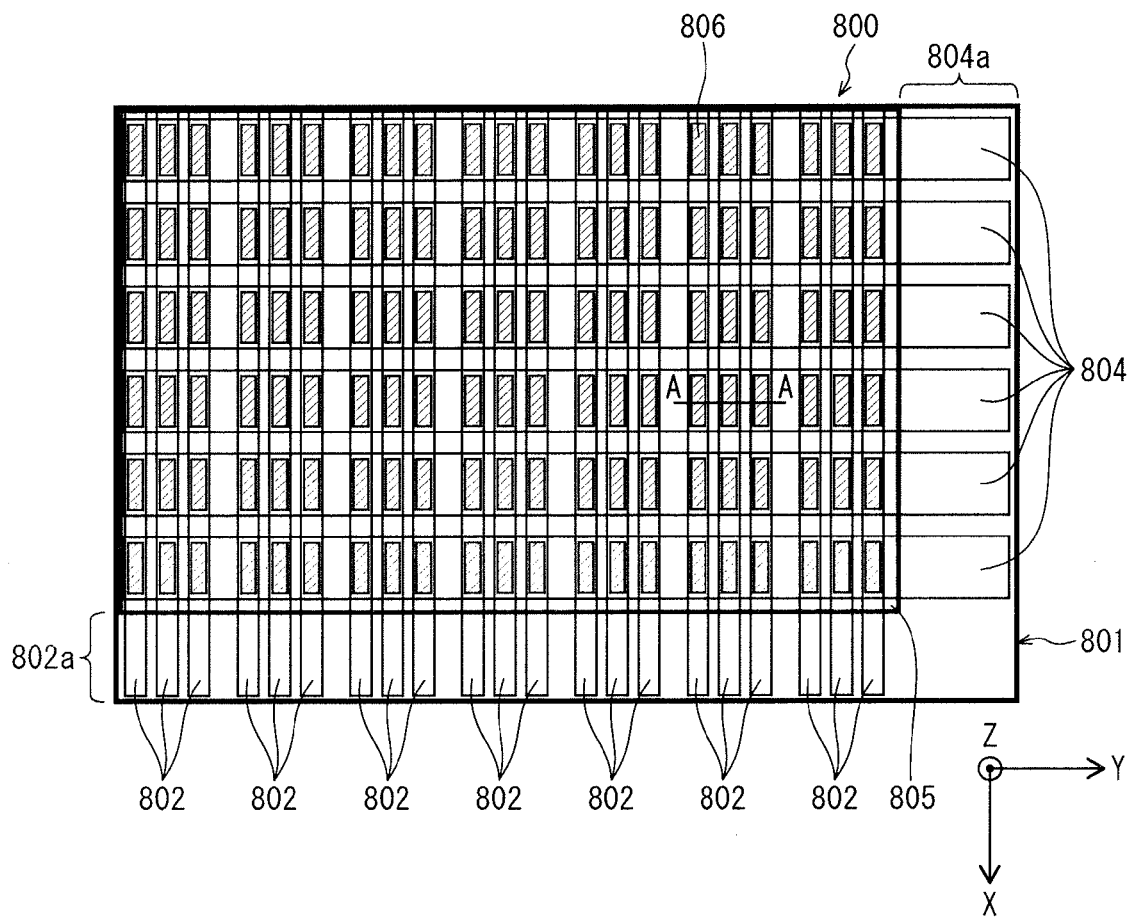
FIG. 9A is a plan view of a passive-matrix display pertaining to conventional technology.
Figure 9B:
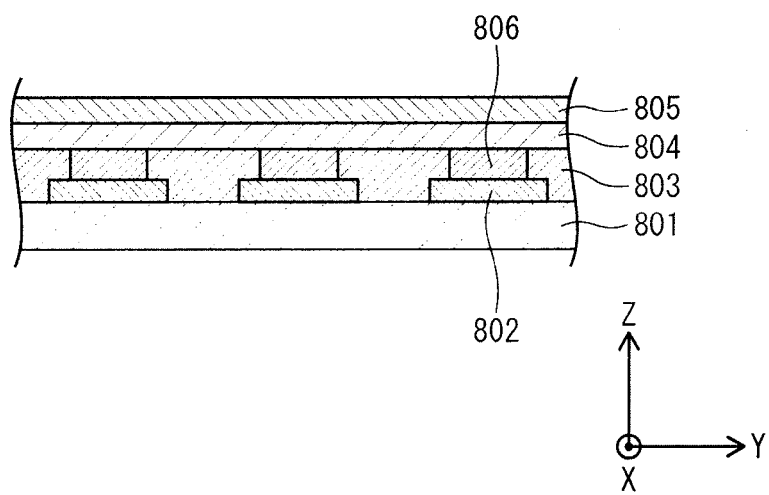
FIG. 9B is a cross-sectional view of the passive-matrix display pertaining to conventional technology.
Figure 10:
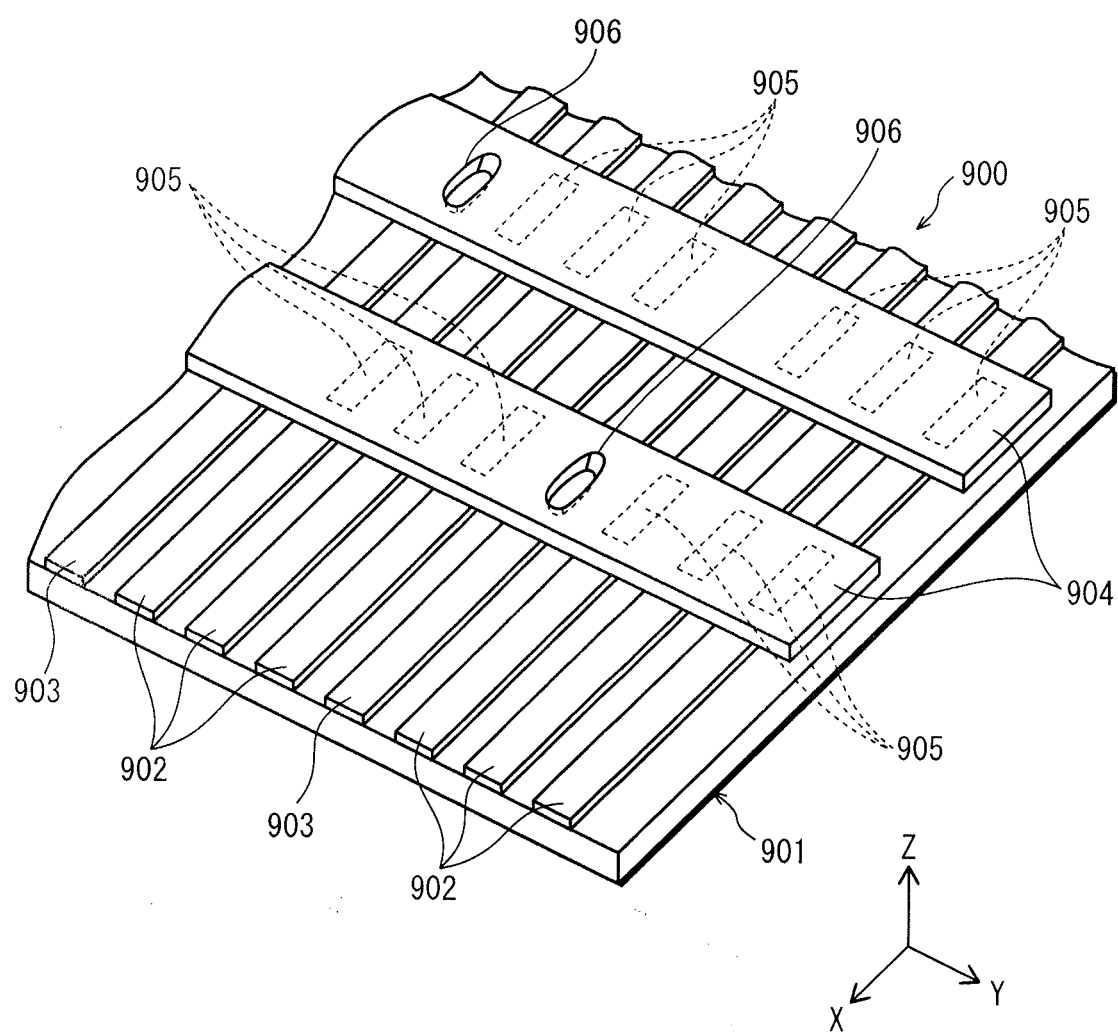
FIG. 10 is a perspective view of the passive-matrix display pertaining to conventional technology.

In Variation 4, the non-display region ND is curved back for a plurality of displays and is in contact with the back of a neighboring display, as shown in FIG. 8C. Variation 4 has merits when using substrates with less flexibility than those of Variations 2 and 3.

<Supplement to Variations 2-4>

The above-described Variations 2-4 involve displays using flexible substrates to enable bending or curving at desired positions. As such the distance between individual pixels facing each other across a border between neighboring displays in the Y-direction is reduced to be equal to the distance between neighboring pixels in the Y-direction within an individual display. Thus, in Variations 2-4, a plurality of displays are perceived as smoothly combined into a single display as the tiling displays 300, 400, and 500.

<Other>

(1) The Embodiment and Variations of the present disclosure describe using an organic electroluminescence layer as the light-emitting layer. However, no such limitation is intended. Any passive-matrix display may be used, including inorganic electroluminescence, field emission display (FED), surface-conduction electron-emitter display (SED), liquid crystal display, and so on are widely applicable.

(2) The Embodiment and Variations of the present disclosure describe a configuration having a second substrate. However, the second substrate may be omitted provided that sufficient constraint against infiltration by water is present from the barrier layer and the sealing film disposed over the light-emitting layer.

(3) The Embodiment and Variations of the present disclosure describe realizing unidirectional wiring by extending the first auxiliary electrodes and the second auxiliary electrodes in the Y-direction. However, no such limitation is intended. The unidirectional wiring may also be extended in the X-direction or in some other direction.

(4) In the Embodiment of the disclosure, the first auxiliary electrodes and the second auxiliary electrodes are described as being in the same layer. However, these electrodes may also be in different layers.

(5) In the Variations of the disclosure, the first substrate and the second substrate are both flexible substrates. However, a configuration in which only one of the substrates is flexible is also applicable.

(6) The passive-matrix display pertaining to the disclosure is applicable not only to a planar configuration but also to a curved or spherical configuration.

(7) In the Embodiment and Variations of the disclosure, the wording "above the substrate" signifies both "on the substrate (in contact with the substrate)" and "higher than the substrate (not in contact with the substrate)".

(8) The passive-matrix display pertaining to the disclosure may also be configured as a combination of Embodiment and Variations, or portions thereof. Also, the materials and numerical values described in the Embodiment and Variations are listed only as beneficial examples, and no limitation is intended thereby. Further, additional variations may be applied to the configuration provided that the technical scope of the disclosure is not exceeded. The present disclosure is widely applicable to all passive-matrix displays.

INDUSTRIAL APPLICABILITY

The present disclosure is applicable to a tiling display used in large-scale digital signage, for example.

REFERENCE SIGNS LIST

1A Display
2 First substrate
3 First electrode
3a First external terminal
3b Third auxiliary electrode
3c Electrode layer
4 Second electrode
5 Light-emitting layer
6 First auxiliary electrode
7 Second auxiliary electrode 7a Second external terminal
15 Second substrate
16 Light-emitting cell
30 First mounting area
40 Second mounting area
100 Tiling display

The invention claimed is:

1. A passive-matrix display, comprising:
a substrate;
a plurality of first electrodes provided as stripes above the substrate;
a plurality of second electrodes provided as stripes above the first electrodes and three-dimensionally intersecting the first electrodes;
a light-emitting layer provided between each of the first electrodes and each of the second electrodes at three-dimensional intersections between the first electrodes and the second electrodes;
a plurality of first auxiliary electrodes provided between the substrate and the first electrodes, three-dimensionally intersecting the first electrodes and being parallel to the second electrodes; and
a plurality of second auxiliary electrodes provided between the substrate and the first electrodes, being parallel to the first auxiliary electrodes and to the second electrodes, wherein
each of the first electrodes and each of the first auxiliary electrodes are electrically connected via a first connection portion, and
each of the second electrodes and each of the second auxiliary electrodes are electrically connected via a second connection portion disposed in plurality, the plurality of second connection portions having at least one of the first electrodes therebetween.

2. The passive-matrix display of claim 1, wherein
as seen in a plan view, each of the second auxiliary electrodes at least partially overlaps one of the second electrodes.

3. The passive-matrix display of claim 1, wherein
the second electrodes are optically transmissive.

4. The passive-matrix display of claim 1, wherein
the substrate is flexible.

5. The passive-matrix display of claim 1, further comprising
a second substrate provided above the second electrodes.

6. The passive-matrix display of claim 1, wherein
the light-emitting layer is an organic electroluminescence layer.

7. The passive-matrix display of claim 1, wherein
each of the second electrodes and each of the second auxiliary electrodes are electrically connected at a respective one of the second connection portions via an electrode layer that includes material having the same composition as the first electrodes.

8. The passive-matrix display of claim 1, wherein
the substrate includes a display region having a periphery at outermost edges of the light-emitting layer, and a non-display region neighboring the display region,
a plurality of first external terminals that connect externally are provided above the substrate in the non-display region,
each of the first auxiliary electrodes and each of the first external terminals are electrically connected,
a plurality of second external terminals that connect externally are provided above the substrate in the non-display region at respective ends of the second auxiliary electrodes,
a plurality of first paths are provided, each extending from the light-emitting layer along one of the first electrodes to one of the first external tee urinals, one of the first paths with a highest wiring resistance having resistance R1,
a second path extends from the same light-emitting layer as the one of the first paths with the highest wiring resistance along one of the second electrodes to one of the second external terminals, the second path having resistance R2, and
R2<R1.

9. The passive-matrix display of claim 1, wherein
the substrate includes a display region having a periphery at outermost edges of the light-emitting layer, and a non-display region neighboring the display region,
a plurality of linear third auxiliary electrodes is provided above the substrate in the non-display region, in the same layer as the first electrodes,
each of the first auxiliary electrodes and each of the linear third auxiliary electrodes are electrically connected via a third connection portion,
the linear third auxiliary electrodes each start at a respective one of the third connection portions and extend away from the display region,
at least a portion of the linear third auxiliary electrodes three-dimensionally intersects at least a portion of the second auxiliary electrodes, a first mounting region being arranged at extremities of a neighboring pair of the linear third auxiliary electrodes, and
the second auxiliary electrodes extend above the substrate from the display region to the non-display region, a second mounting region being arranged at extremities of a neighboring pair of the second auxiliary electrodes.

10. A tiling display, comprising
the passive-matrix display of claim 1, provided in plurality and combined into a single display.

* * * * *